United States Patent [19]

Suzuki

[11] 4,142,233
[45] Feb. 27, 1979

[54] REFRESHING SYSTEM FOR DYNAMIC MEMORY

[75] Inventor: Seigo Suzuki, Yokohama, Japan

[73] Assignee: Tokyo Shibaura Electric Co., Ltd., Kawasaki, Japan

[21] Appl. No.: 733,925

[22] Filed: Oct. 19, 1976

[30] Foreign Application Priority Data

Oct. 30, 1975 [JP] Japan .................. 50-129872
Oct. 30, 1975 [JP] Japan .................. 50-129873
Oct. 30, 1975 [JP] Japan .................. 50-129874
Oct. 30, 1975 [JP] Japan .................. 50-129875

[51] Int. Cl.² .................. G06F 13/00; G11C 7/00
[52] U.S. Cl. .................. 364/200; 365/222
[58] Field of Search .................. 340/173 DR; 364/200 MS File, 900 MS File; 365/222

[56] References Cited

U.S. PATENT DOCUMENTS

| | | | |
|---|---|---|---|
| 3,333,252 | 7/1973 | Shimabukuro | 364/200 |
| 3,737,879 | 6/1973 | Greene et al. | 340/173 DR |
| 3,748,651 | 7/1973 | Mesnik | 340/173 DR |
| 3,790,961 | 2/1974 | Palfi et al. | 340/173 DR |
| 3,810,129 | 5/1974 | Behman | 340/173 DR |
| 3,811,117 | 5/1974 | Anderson, Jr. | 340/173 DR |

*Primary Examiner*—Harvey E. Springborn
*Attorney, Agent, or Firm*—Finnegan, Henderson, Farabow & Garrett

[57] ABSTRACT

The central processing unit (CPU) is interrupted at a predetermined time interval by an external timer. In the CPU, the first priority is given to the interruption and the instruction for refreshing the contents of the dynamic memory or the instruction including such a refreshing function is executed in the intervals of the program execution.

8 Claims, 13 Drawing Figures

REFRESHING SYSTEM FOR DYNAMIC MEMORY

BACKGROUND OF THE INVENTION

The present invention relates to a system for refreshing the contents of dynamic memories associated with a data processor.

It is a common practice that semiconductor memories are employed for the main memory of an electronic computer system, for example, a microcomputer. In this case, the dynamic memory is more often used that the static memory, because of the suitability of the dynamic memory ascribable to its nature, and its low cost. The dynamic type semiconductor memory, however, suffers from the fact that the memory contents are volatilized in a fixed time period (about several milliseconds). This necessitates the refreshing of the memory contents at a predetermined time interval.

In the case of the most popular type dynamic memory of 4 K words × 1 bit, i.e. of 4096 bits, for example, the refreshing operation is made in such a manner that the memory cells of 64 in row are first refreshed and this refreshment is repeated sixty-four times in column direction, because of the 64 × 64 matrix of such memory construction. The memory cells of the 4096 bits are addressed by applying a binary-coded address signal binary-coded to 12 address lines, because of $2^{12} = 4096$. The refreshing of the memory cells may also be performed by using the address lines. More specifically, the refreshing operation is periodically performed by one of the grouped lines. That is, 12 address lines are divided into two groups each consisting of 6 lines.

The construction of the refreshing system using such dynamic memory device is in a block form shown in FIG. 1. In the figure, reference numeral 1 designates a dynamic memory, 2 a refresh circuit, and 3 a control circuit for the whole of the dynamic memory 1 (for example, 4096 bits). The control circuit 3 also controls the data flow between the dynamic memory 1 and a central processing unit which is abbreviated as CPU 4. The refreshing operation of the refreshing system is time-charted in FIG. 2. FIG. 2(a) shows an operating condition of the dynamic memory 1, in which A is the time-period required for the memory 1 to be refreshed, and B is the time-period permitting the memory 1 to be accessed from exterior. FIG. 2(b) shows a kind of ready signal from the control circuit 3 to the CPU 4. When the ready signal of FIG. 2(b) is a logical level "1," the memory 1 is under an operable condition. In other words, the CPU 4 is freely accessible to the memory 1. Conversely, when the logical level of the ready signal is "0," the dynamic memory 1 is being refreshed and the CPU 4 is prohibited from accessing to the memory 1. The operation as shown in the time chart in FIG. 2(b) must be repeated every N ms because of the proper characteristic of the semiconductor dynamic memory used. Accordingly, the CPU 4 is prohibited from the operation of program execution every time-period A. The result is that the data processing efficiency of the electronic computer system is reduced.

SUMMARY OF THE INVENTION

Accordingly, an object of the present invention is to provide a refresh system for refreshing the memory contents of the dynamic memory in which the contents of the dynamic memory may efficiently be refreshed without prohibiting the operation of the CPU and thus the data processing efficiency of the electronic computer system is improved.

THe present invention may briefly be summarized as involving a refreshing system for refreshing the contents of the dynamic memory in which the CPU is interrupted at a predetermined time interval by an external timer, and, giving the first priority to the interruption, the CPU executes the instruction for refreshing the contents of the dynamic memory.

Other objects and features of the present invention will be apparent from the following description taken in connection with the accompanying drawings, in which:

DETAILED DESCRIPTION OF THE PREFERRED EMBODIMENTS

Figure 3:
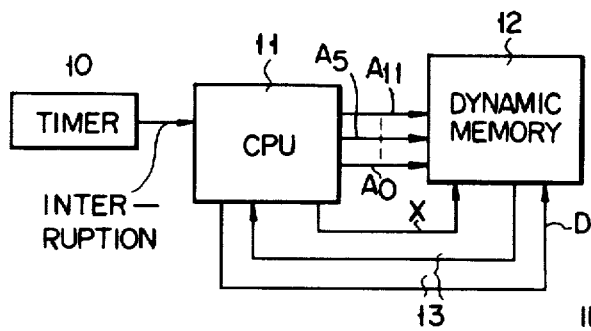
FIG. 3 is a block diagram of a refreshing system according to the present invention.

Reference is now made to FIG. 3 illustrating the first embodiment of a refreshing system for refreshing the contents of a dynamic memory according to the present invention. In the figure, reference numeral 11 is a central processing unit (CPU), 12 a 4 K bits dynamic memory associated with the CPU, the memory comprising a 64 × 64 matrix of 4096 bits, and $A_0$ to $A_{11}$ address lines of the dynamic memory 12 for selecting the desired memory cells of the memory 12. In this specification, characters $A_0$ to $A_{11}$ will be used for doubly designating the address lines and the corresponding address signals for ease of explanation. The address lines $A_0$ to $A_5$ are used to refresh the contents of the dynamic memory 12. A line X is a chip select line used for the memory contents refreshing. Reference numeral 13 is a data bus for connecting the dynamic memory 12 with the CPU 11.

Figure 1:
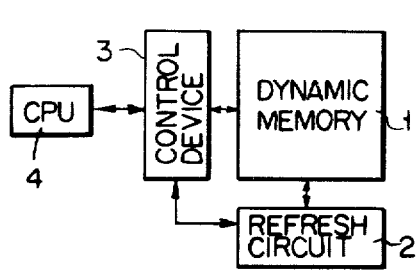
FIG. 1 is a block diagram of a conventional refreshing system for refreshing the contents of the dynamic memory.
Figure 4:
FIG. 4 is a format of the instruction for refreshing the memory contents which is employed in the refreshing system of FIG. 3.
Figure 2:
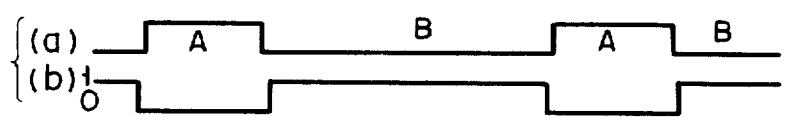
FIG. 2 is a timing chart for illustrating the operation of the system of FIG. 1.
Figure 5:
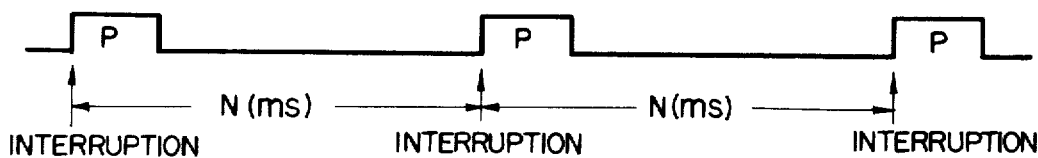
FIG. 5 is a timing chart for illustrating the operation of the refreshing system of FIG. 3.

One form of the format of the instruction used for refreshing the memory contents of the dynamic memory 12 is shown in FIG. 4. This instruction is a block transfer instruction for transferring memory contents from memory area A to memory area B by the direct memory access (DMA) mode transfer. In actual refreshing operation, an exterior timer 10 feeds an interruption signal to the CPU 11 and, upon receipt of the interruption signal, the CPU 11 is interrupted every N ms, as shown in FIG. 5. The first priority is given to the interruption. The interruption causes the CPU 11 to execute the instruction P every N ms, as shown in FIG. 5. If the instruction P is a block transfer instruction, the transfer instruction P of $2^6 \times 64$ words is prepared since 64 memory cells in row of the $64 \times 64$ matrix must be successively scanned 64 times in column direction by using the address lines $A_0$ to $A_5$. Since the address lines $A_0$ to $A_5$ are scanned through the execution of the instruction P, the contents of the dynamic memory 12 are completely refreshed. Incidentally, the length of the time-period N ms depends on the memory cells used.

Figure 6:
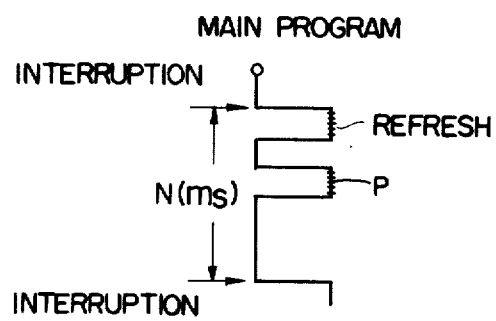
FIG. 6 is a flow chart of the program for illustrating the operation of the refreshing system of FIG. 3.

The CPU 11 executes an operation such as a cycle steal mode by an interior or exterior control, during the time-period that the CPU 11 executes the block transfer instruction P. FIG. 6 shows a flow chart when the CPU 11 executes the main program and the instruction for refreshing the memory contents of the memory in the cycle steal mode. Alternately, another processor corresponding to the CPU 11 may use the memory 12 during an idle period P as shown in FIG. 5 by a cycle steal mode. Conversely, the CPU 11 actively executes the refreshing operation of the memory contents upon the interruption signal. This brings about the following merits:

(a) Since the construction is simplified as shown in FIG. 3, it is very effective when it is applied to a system requiring a low cost and a compactness such a microcomputer;

(b) The refreshing operation of the prior art was placed unilaterally under the control of the dynamic memory. However, according to the present invention, the refreshing system is under the control of the CPU and the program so that the entire system may be controlled by the program. For example, the program control can be set up not to refresh an unnecessary data memory region of the memory. This can be accomplished by incorporating data designating the unnecessary data memory region in the instructions A and B.

Figure 7:
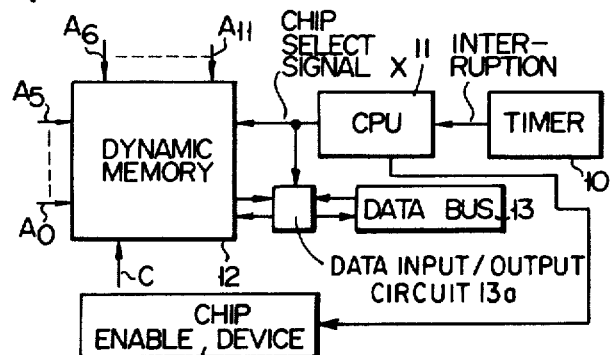
FIG. 7 is a block diagram of another embodiment of the refreshing system according to the present invention.

In the embodiment of FIG. 7, the dynamic memory 12 receives address signals $A_0$ to $A_5$ and $A_6$ to $A_{11}$, a chip enable signal C from the chip enable device 21, the input/output data D to be transferred through a data input/output circuit 13a and the data bus 13, and a chip select signal X fed from the CPU 11. The dynamic memory 12 is made of a plurality of chip memories. Each of the chip memories has the same number of addresses and is commonly accessed by the address signals $A_0$ to $A_{11}$. When the dynamic memory 12 is accessed, one of the chip memories is designated by means of the chip select signal X and the chip enable signal C and the desired address of the selected chip memory is designated by the address signals $A_0$ to $A_{11}$. The chip select signal X is used to switch the data input/output circuit 13a connected between the memory 12 and the data bus 13, and the chip enable signal C is used to refresh the memory contents of the memory 12. For example, when the chip select signal X is the logical level "0," the writing of the data D into the memory 12 is prohibited and the reading of the data onto the data bus 13 is also prohibited. At the same time the refreshing operation of the memory contents of the memory 12 is executed.

Figure 8:
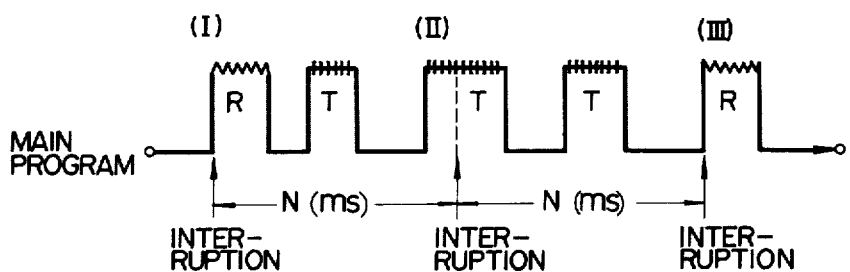
FIG. 8 is a flow chart of the program for illustrating the operation of the refreshing system of FIG. 7.

FIG. 8 shows a program chart showing the operation mode of the memory 12 of FIG. 7, in which character R is the refreshing period of the memory contents of the memory 12, and character T designates the block transferring period in the direct memory access (DMA) mode in the memory region. More precisely, when the exterior timer 10 issues an interruption request every N ms through the CPU, the CPU, at the stage I, receives the interruption to feed the chip select signal X to the dynamic memory 12 to issue the refreshing instruction for memory contents refreshing. The refreshing operation may be performed by using the address signals $A_0$ to $A_5$ issued from the CPU 11, but in fact it may be carried out by the block transfer instruction for transferring a memory block of 64 words, if the dynamic memory chip is the one of 4 K words. This is shown in stage III. In stage II, CPU is executing the block transfer instruction and the refreshing operation progresses. If the execution of the block transfer instruction has been performed in the program, the operation mode of the CPU instantly returns to the main program execution despite an interruption signal. No refreshing operation is necessary under either of the following conditions:

(a) The memory block or region to be transferred by the block transfer instruction being executed at the stage II has the length of 64 words or more; or (b) When it has been designated in the program that refreshing of the data in the corresponding memory region is unnecessary.

The requirement of the item (b) may be satisfied, since the refreshing operation is under the program control. However, with respect to the item (a), it is undesirable that the word lengths of the memory blocks to be transferred by all the block transfer instructions are selected to have 64 words or more. For example, the I/O unit for the computer very frequently requires the block data to consist of several words. If blocks of 64 words are always transferred, the transfer of unnecessary data to the I/O unit in each block transfer brings about many undesirable results.

Figure 9:
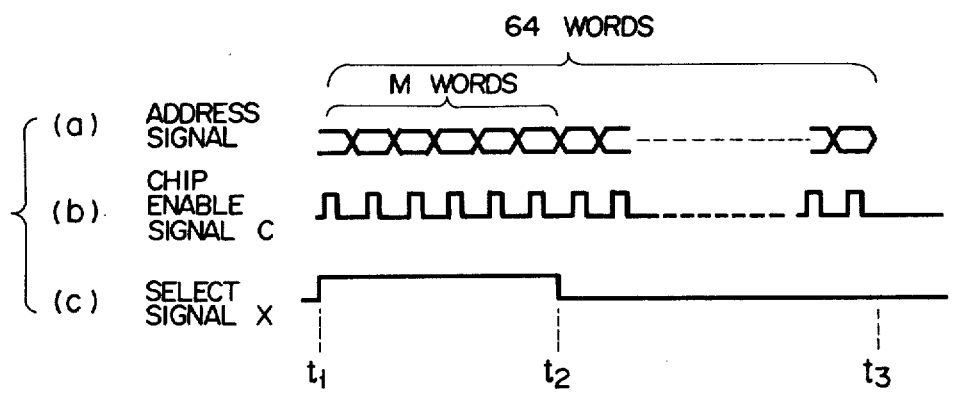
FIG. 9 is a timing chart for illustrating the operation of the refreshing system of FIG. 7.

FIG. 9 shows a timing chart for illustrating the operation of the refreshing system of FIG. 7 using a 4 K bits memory 12. In the figure, $t_1$ is a time point providing the initiation of the block transfer and $t_2$ a time point providing substantial termination of the words transfer having been designated in the programs, for example, M words. Note here that if $M \geq 64$, the block transfer instruction terminates at time $t_2$ and the contents of the dynamic memory have been refreshed. If $M < 64$ as illustrated in FIG. 9, the CPU 11 sets the select signal X to be "0" in level at the Mth word counted from the block transfer instruction initiation time $t_1$, to prohibit the read and write operations of the dynamic memory 12. Then, the CPU continues to feed the chip enable signal C to the memory 12 and at the same time continues the address counting operation by the address signals $A_0$ to $A_5$ until the 64th word, leading to the completion of the refreshing operation of the 64 words. Thus, the address counting of 64 words ends at time $t_3$ in FIG. 9 and, the refreshing operation in the case of $M < 64$ is completed. And at time $t_3$ the DMA raises a flag representing the end of block transfer. Note here that this flag under $M < 64$ is different from that under $M \geq 64$ at time $t_2$. During the period from $t_2$ to $t_3$ in the case of $M < 64$, the CPU exclusively executes the refreshing operation but gives no block transfer of unnecessities. In this manner the refreshment of 64 words is ensured at a predetermined time interval under the CPU 11 control.

Figure 10:
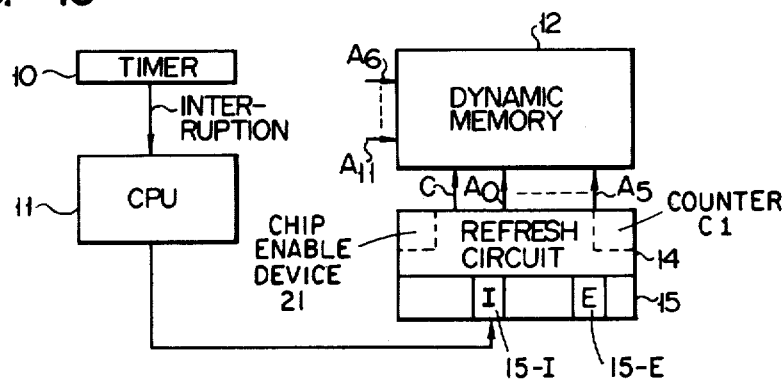
FIG. 10 is a block diagram of still another embodiment of the refreshing system according to the present invention.

Turning now to FIG. 10, there is shown another embodiment of the refreshing system according to the present invention. In this example, the contents of the dynamic memory 12 are refreshed by the refreshing instruction from the CPU 11 fed through an additional refreshing circuit 14. The refreshing circuit 14 includes a device 21 for generating the chip enable signal C and a counter C1 for scanning the dynamic memory 12 by the address signals $A_0$ to $A_5$. Reference numeral 15 is a register associated with the refreshing circuit 14, in which the I bit section 15-I is used to designate the refresh initiation for accepting the refresh instruction fed from the CPU 11 and the E bit section 15 E is allotted for the confirmation of the end of the refreshing operation. THe respective bit sections I and E may constitute well-known flip-flops.

Figure 11:
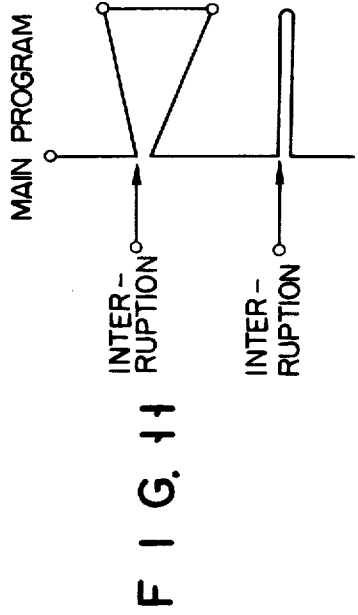
FIG. 11 is a flow chart of the program for explaining the operation of the system of FIG. 10.

Accordingly, as shown in FIG. 11, the main program of the CPU 11 of FIG. 10 jumps to a proper process routine to enter the refresh routine, when the interruption signal is inputted to the CPU 11 at a predetermined time interval, from the external timer circuit 10. When performing the refresh routine, the CPU 11 sets the I bit section 15-I of the register 15 to be "1" to instruct the refreshing circuit 14 to initiate the refreshing operation. The refresh circuit 14 initiates the refreshing operation as the I bit section of the register 15 becomes the logical level "1," and causes the E bit section 15-E of the register 15 to be the logical level "1" at the completion of the refreshment. The CPU 11 confirms the end of the refreshment in response to the "1" of the E bit section 15-E, and returns to the main program execution. In this case, as shown in FIG. 11, the interruption requirement for refreshment is delivered at a predetermined time interval. However, in case where the dynamic memory 12 is not used in the program, for example, unnecessary data is stored in the memory 12, this condition is checked in the refresh routine, causing the CPU instantly to return to the main program without the refreshment execution. It will be understood that flip-flop circuits may be used for the register 15 associated with the refresh circuit 14 in FIG. 10.

Figure 12:
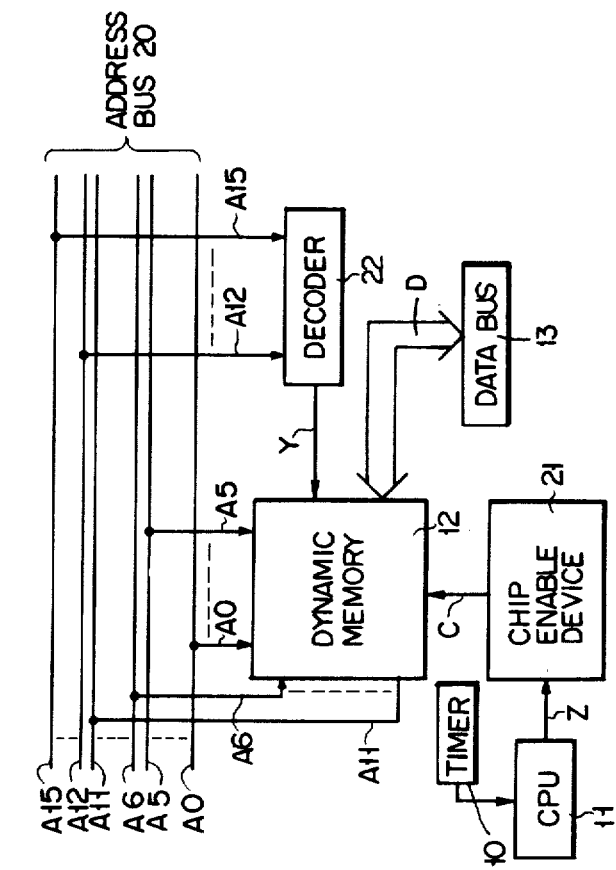
FIG. 12 is a block diagram of another embodiment of the refreshing system according to the present invention.
Figure 7:
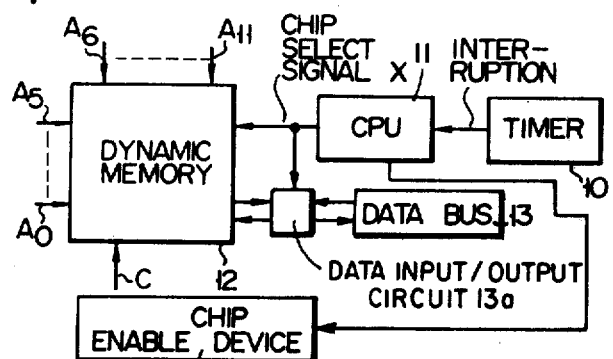
Figure 8:
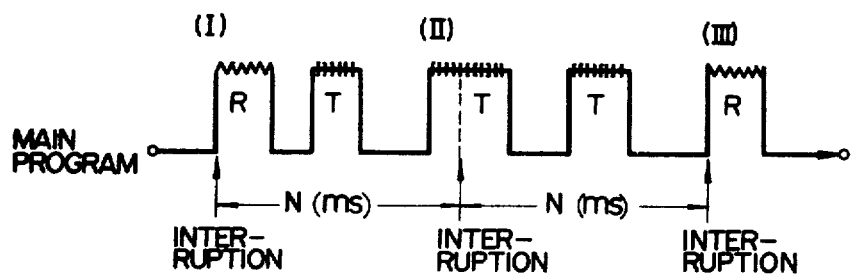
Figure 9:
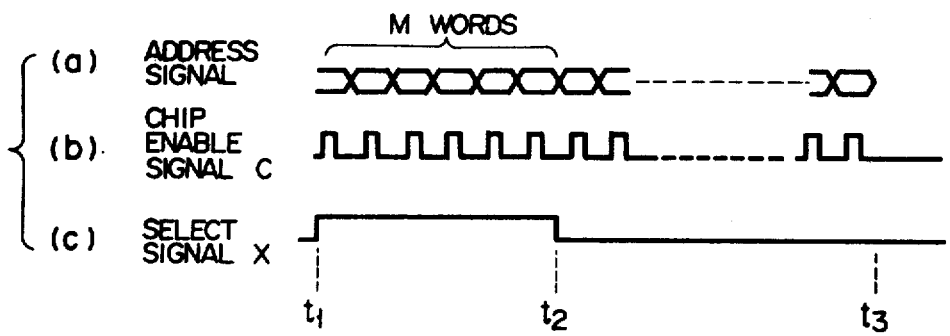
Figure 10:
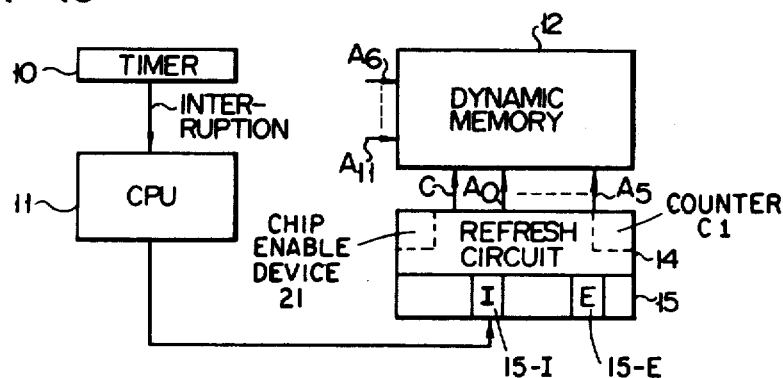

In the embodiment of FIG. 12, an address bus 20 is used for delivering the address signals $A_0$ to $A_5$ and $A_6$ to $A_{11}$ to the dynamic memory 12 of $64 \times 64$ matrix. The dynamic memory 12 receives the chip enable (select) signal C fed from a chip enable device 21. The select signal C also acts as the timing signal for refreshment. The timing signal for the chip enable device 21 designated by character Z is produced from an external timing signal generator or timer 10 and outputted through the CPU 11. The dynamic memory 12 also receives a select signal Y for switching an output buffer fed from a decoder 22. The decoder 22 acts to decode the address signals $A_{12}$ to $A_{15}$ from the address bus 20 for switching the signal level of the select signal Y in accordance with the results of decoding. The select signal Y is timed relative to the select signal C. The dynamic memory 12 is coupled with a data bus 13 through a data input/output line D. Ordinarily, a single line is used for the data input/output line D, with a common path for the input and output data flows. As a matter of course, two separate lines may be used for the respective input and output data flows. Although not shown in the figure, a plurality of the systems shown in FIG. 12 may be connected to the bus lines 20 in parallel fashion.

When the address signals $A_{12}$ to $A_{15}$ of four bits are decoded in the decoder 22, a predetermined level of the select signal Y designating if the dynamic memory 12 has no memory region to be addressed by the address signals $A_0$ to $A_{11}$ is obtained. In this case, the output select signal Y of the decoder 22 becomes "0." Conversely, if the memory 12 has the memory region to be addressed, the select signal Y becomes "1." Assume now that the select signal Y is "0," the outut buffer (not shown) providing a connection from the dynamic memory 12 to the data bus 13 through the data input/output line D is separated electrically. Accordingly, the output of the dynamic memory 12 to the data bus 13 is prohibited while the contents of the dynamic memory 12 are refreshed by the address signals $A_0$ to $A_5$ and the select signal C. In the case of "1" of the select signal Y, the output of the dynamic memory 12 is permitted to pass to the data bus 13 through the output buffer and the data input/output line D, while at the same time the contents of memory 12 are refreshed.

In the system construction of FIG. 12, the timing signals C and Z to be applied to the dynamic memory 12 are constantly generated at a predetermined time interval N ms. This ensures the refreshing operation of the memory 12 at a predetermined time interval. Further, with respect to the access of the CPU to the memory 12, a simple operation of the switching of the select signal Y level enables the necessary data to be transferred onto the data bus 13 from the memory 12 without any timing loss.

Figure 13:
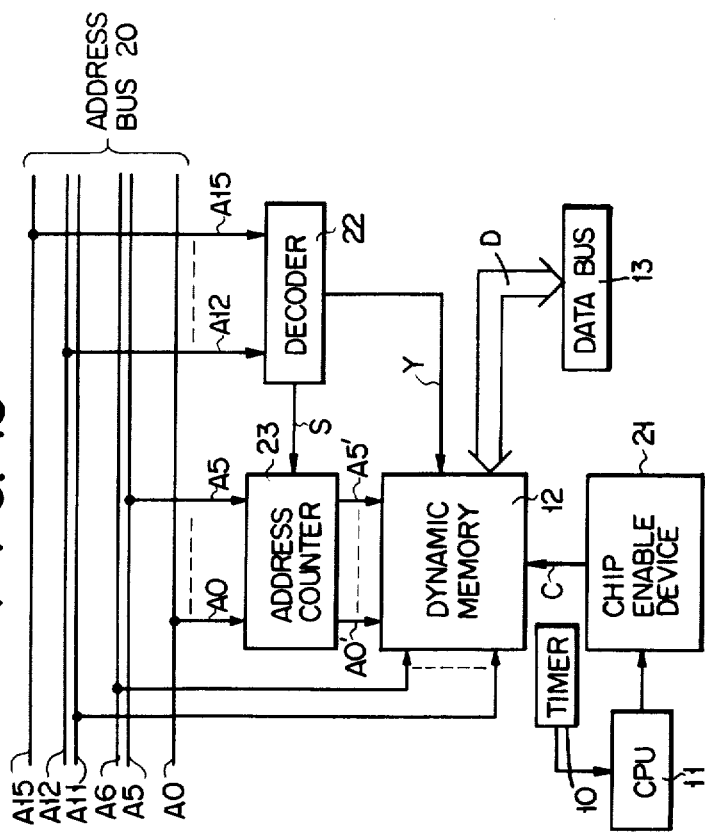
FIG. 13 is a block diagram of the refreshing system which is a modification of the refreshing system of FIG. 12.

While, in the embodiment of FIG. 12, the address signals $A_0$ to $A_5$ fed through the address bus 20 are directly used as the address signals for refreshing, in the embodiment of FIG. 13, the address signals $A_0$ to $A_5$ are supplied to an address counter 23 of which the output is in turn applied to the memory 12 in the form of $A_0'$ to $A_5'$ of address signals. When the address signals $A_{12}$ to $A_{15}$ are decoded, it is found that the dynamic memory 12 has no memory region to be addressed by the address signals $A_0$ to $A_{11}$. In such a case, only the refreshment of the memory contents is performed through the scanning of the signals $A_0'$ to $A_5'$ by the address counter 23 corresponding to the address signals $A_0$ to $A_5$. On the other hand, if the memory has the memory region to be addressed by the address signals $A_0$ to $A_{11}$, the address counter 23 is disconnected from the circuit and the regular address signals $A_0$ to $A_5$ are used. In this case, the selection as to whether the address counter 23 is or is not used is made by applying to the address counter 23 the switching signal S from the decoder 22 to see if the memory 12 has the memory region to be addressed. Also, in this case, during the operation of the address counter 23, the data output buffer of the dynamic memory 12 is disconnected from the data bus 13, while, when the address counter 23 is disconnected electrically from the circuit, the output buffer of the memory 12 is connected with the data bus 13.

What is claimed is:

1. A system for refreshing the contents of a dynamic memory comprising an external timer for generating a signal at a predetermined time interval, and a central processing unit connected between said timer and said dynamic memory for receiving said signal as a first priority interruption to the central processing unit, said central processing unit including means responsive to said signal for executing an instruction for refreshing the contents of a block of the dynamic memory or for executing a block transfer instruction in direct memory access mode 2. The system according to claim 1 wherein said central processing unit includes means for executing a program in a cycle steal mode while the contents of the dynamic memory are not being refreshed.

3. The system according to claim 1 wherein said central processing unit includes means for preventing the refreshing of unnecessary data in said dynamic memory.

4. The system according to claim 1 wherein said central processing unit includes means for continuously generating timing signals when the execution time period of said block transfer instruction is shorter than the time period necessary for refreshing the contents of a block of said dynamic memory and means responsive to said continuously-generated timing signals for completing the refreshing of said block of said dynamic memory.

5. The system according to claim 4 wherein said central processing unit includes means responsive to a signal generated from said timing signal generating means during the block transfer instruction for executing the refreshing operation without performing read/write operations of the dynamic memory.

6. The system according to claim 1 which further includes a refresh circuit connected between said central processing unit and said dynamic memory for refreshing the contents of a block of said dynamic memory in response to an instruction including a refreshing function from said central processing unit, said refresh circuit including means for controlling the refreshing of said contents of said dynamic memory in response to said instruction.

7. The system according to claim 1 further including address bus means connected to said dynamic memory for generating address signals for said dynamic memory, decoding means connected between said address bus means and said dynamic memory for decoding an address signal from said address bus and providing a switching signal indicating whether of not said dynamic memory has a memory region to be addressed by said decoded address, means responsive to said switching signal for disconnecting said dynamic memory from a data bus means when said dynamic memory has no memory region to be addressed by said decoded address, means responsive to another address signal from said address bus from refreshing the contents of said memory when said data bus and dynamic memory are disconnected, and means responsive to said switching signal for concurrently refreshing the contents of said dynamic memory and outputting data from said dynamic memory to said data bus when said dynamic memory has a memory region to be addressed by said decoded address.

8. The system according to claim 7 wherein said means responsive to another address signal for refreshing the contents of said memory when said data bus and dynamic memory are disconnected comprises an address counter connected between said address bus and said dynamic memory and wherein said means for concurrently refreshing and outputting data from said dynamic memory includes means for disconnecting said address counter from said dynamic memory and directly applying said another address signal to said dynamic memory when said dynamic memory has a memory region to be addressed by said decoded address.

* * * * *

UNITED STATES PATENT AND TRADEMARK OFFICE
CERTIFICATE OF CORRECTION

PATENT NO. : 4,142,233
DATED : Seigo Suzuki
INVENTOR(S) : February 27, 1979

It is certified that error appears in the above-identified patent and that said Letters Patent are hereby corrected as shown below:

Sheet 2 of the drawings should be deleted to insert the attached sheet 2 therefor.

Signed and Sealed this

Fifteenth Day of May 1979

[SEAL]

Attest:

RUTH C. MASON
Attesting Officer

DONALD W. BANNER
Commissioner of Patents and Trademarks